United States Patent [19]

Imaichi et al.

[11] Patent Number: 5,108,822
[45] Date of Patent: Apr. 28, 1992

[54] RESONANT TAG AND METHOD OF MANUFACTURING THE SAME

[75] Inventors: Hideaki Imaichi; Takeshi Matsumoto; Yuji Suzuki; Koichi Himura; Tadayoshi Haneda, all of Chigasaki, Japan

[73] Assignee: Tokai Electronics Co., Ltd., Japan

[21] Appl. No.: 634,529

[22] Filed: Dec. 27, 1990

[30] Foreign Application Priority Data

Aug. 6, 1990 [JP] Japan .................................. 2-206791
Sep. 27, 1990 [JP] Japan .................................. 2-255210

[51] Int. Cl.$^5$ .............................................. B32B 9/00
[52] U.S. Cl. ..................................... 428/209; 428/457; 428/461; 428/515; 428/901; 29/592.1; 29/848; 343/895; 340/572
[58] Field of Search ............... 343/895; 29/848, 592.1; 340/572; 428/209, 457, 461, 515, 901

[56] References Cited

U.S. PATENT DOCUMENTS

| | | | |
|---|---|---|---|
| 3,913,219 | 10/1975 | Lichtblau | 29/592.1 |
| 3,967,161 | 6/1976 | Lichtblau | 340/572 |
| 4,369,557 | 1/1983 | Vandebult | 29/848 |
| 4,583,099 | 4/1986 | Reilly et al. | 343/895 |
| 4,689,636 | 8/1987 | Tait et al. | 343/895 |

*Primary Examiner*—Patrick J. Ryan
*Attorney, Agent, or Firm*—Finnegan, Henderson, Farabow, Garrett & Dunner

[57] ABSTRACT

A resonant tag is manufactured in the manner described below: a conductive thin film is formed to a predetermined thickness on two surfaces of an insulating thin film. Thereafter, a conductive pattern, composed of an inductor element and a capacitor element corresponding to a resonant frequency of a resonant circuit, is printed on a surface of one of the conductive thin films, and a conductive pattern, composed of a capacitor element corresponding to the resonant frequency of the resonant circuit, is printed on a surface of the other insulating thin film at a position which faces the capacitor element formed on one of the conductive thin films using an ink which resists etching. A non-printed portion of the conductive thin films is removed by etching to form a resonant circuit pattern. Thereafter, a portion of the insulating thin film, which corresonds to the capacitor element pattern, is thinned to a desired thickness by pressing a heating/pressing member heated to a predetermined temperature against that portion under a predetermined pressure for a predetermined period of time.

6 Claims, 4 Drawing Sheets

RESONANT TAG AND METHOD OF MANUFACTURING THE SAME

BACKGROUND OF THE INVENTION

The present invention relates to a resonant tag and a method of manufacturing a resonant tag. Particularly, the present invention is concerned with a resonant tag to be adhered to an item on sale for the confirmation of a robbery such as a shoplifting, and a method of manufacturing such a resonant tag.

Conventional resonant tags used for the purpose of preventing robbery such as shoplifting in supermarkets, speciality stores or department stores contain a resonant frequency circuit which is manufactured in the manner described below. Aluminum foils having different thicknesses are bonded by various bonding methods to the two surfaces of a synthetic resin film, such as a polyethylene, having a predetermined thickness and serving as a dielectric. Subsequently, a RL circuit pattern is printed on the surface of the aluminum foil having a larger thickness by, for example, gravure printing, and a capacitor circuit pattern is printed on the surface of the aluminum foil having a smaller thickness by the same printing method. Thereafter, etching is conducted on the aluminum foils using an alkali (caustic soda) or acid (ferric chloride) chemical.

It is possible to manufacture RLC resonant frequency tags by electrically connecting the RL circuit and the capacitor circuit, although the manufacture depends on the resonant frequency and the size of the tag.

In the resonant tag manufactured in the manner described above, the synthetic resin film, such as polyethylene, used as the dielectric, is formed by melting a resin and then by forming the molten resin by the extrusion.

Hence, the thickness of the synthetic resin film such as polyethylene, which is used as the dielectric in the resonant tag, is not uniform in both the direction of extrusion and the direction transverse to it, non-uniformity depending on the precision of the extruder and the skill of the manufacturing technique. That is, the thickness of the synthetic resin film varies within a certain percentage range of the designed thickness.

When resonant tags are manufactured, a large number of resonant tags are arranged in rows and columns on a material which is as wide as possible to achieve reduction in the production cost. This makes the thickness of the dielectrics of all the tags arranged in rows and columns varied.

Variations in the resonant frequency of the resonant tag is largely affected by variations in the thickness of the dielectric of a capacitor circuit.

In consequence, variations in the thickness of the dielectrics of the respective resonant tags cause variations in the resonant frequencies of the respective resonant tags.

This may generate large amount of partially defective resonant tags whose resonant frequency is varied greatly due to the variations in the thickness of the dielectric in both directions of the arrangement, although the amount finally depends on the performance of an electronic detector for detecting passage of a resonant tag. That is, resonant tags whose resonant frequency cannot be detected by the electronic detector are generated. This greatly reduces the productivity and raises the production cost.

In the case of the resonant tags whose size is the same and in which the circuit contains a capacitor portion, the area of an electrode plate for the capacitor must be reduced to enhance the performance. In that case, the thickness of the dielectric which corresponds to the capacitor circuit must be reduced to obtain the same resonant frequency.

However, manufacture contains various types of machinings including etching, so the resonant tag must have a sufficient mechanical strength which resists these machinings. Hence, there is a limitation to the reduction in the thickness of the dielectric such as the synthetic resin film.

Furthermore, difficulty with which the accuracy of the extruder is obtained in inverse proportion to the thickness of the dielectric.

At present, the lower limit of the thickness of the synthetic resin film which can be manufactured under the above conditions is 25 microns ±4 microns in terms of the precision of the extruder and the strength of the material required for the machinings.

SUMMARY OF THE INVENTION

In view of the aforementioned problems of the related art, an object of the present invention is to provide a resonant tag in which the portion of a dielectric, which corresponds to an electrode plate of a capacitor and which affects a resonant frequency of a resonant tag, is controlled to a uniform and desired thickness, and in which the area of the electrode plate of the capacitor is reduced, as well as a method of manufacturing such a resonant tag.

To this end, the present invention provides a resonant tag which comprises an insulating thin film, a conductive capacitor element pattern and a conductive inductor element pattern which are formed on one surface of the insulating thin film, the conductive capacitor element pattern corresponding to a resonant frequency and the conductive inductor element pattern being located outside of the conductive capacitor element pattern, and a conductive capacitor element pattern formed on the other surface of the insulating thin film at least at a position which faces the conductive capacitor element pattern formed on one surface, the conductive capacitor element pattern corresponding to the resonant frequency. At least almost the portion of the insulating thin film on which the two conductive capacitor element patterns are formed is thinned to a predetermined thickness corresponding to the resonant frequency. The individual conductive patterns form an LC resonant circuit having an inherent resonant frequency.

The present invention further provides a method of manufacturing such a resonant tag which comprises the steps of forming a conductive thin film to a predetermined thickness on two surfaces of an insulating thin film, printing, on a surface of one of the conductive thin films, a first conductive pattern composed of an inductor element and a capacitor element corresponding to a resonant frequency of a resonant circuit using an ink which resists etching, as well as a second conductive pattern composed of a capacitor element corresponding to the resonant frequency of the resonant circuit on a surface of the other insulating thin film at a position which faces the capacitor element formed on the first conductive thin film using the ink which resists etching, removing a non-printed portion of the conductive thin films by etching, thinning at least a portion of the insulating thin film corresponding to the capacitor element pattern in a resonant circuit pattern formed by the etching process to a desired thickness by pressing a heating/pressing member heated to a predetermined temperature against that portion under a predetermined pressure for a predetermined period of time, and forming a LC resonant circuit in the desired resonant circuit pattern by electrically connecting the first conductive and second conductive patterns.

In this way, the portion of the insulating thin film corresponding to the capacitor element pattern whose variations of the thickness vary the resonant frequency can be thinned to a desired thickness with a very high degree of accuracy. This enables provision of a resonant tag incorporating a resonant circuit having a desired resonant frequency.

Further objects, features and advantages of the present invention will become apparent from the following detailed description of embodiments of the present invention with reference to the accompanying drawings.

DETAILED DESCRIPTION OF THE PREFERRED EMBODIMENT

An embodiment of the present invention will now be described with reference to the accompanying drawings.

In this embodiment, a resonant tag has a resonant circuit which has a resonant frequency inherent to the circuit and which is formed on an insulating thin film. The resonant circuit contains one RL circuit (inductor element) and one capacity (capacitor circuit element) formed integrally with the RL circuit. The resonant circuit is a RLC circuit which can be tuned to resonance at a given frequency.

Figure 1:
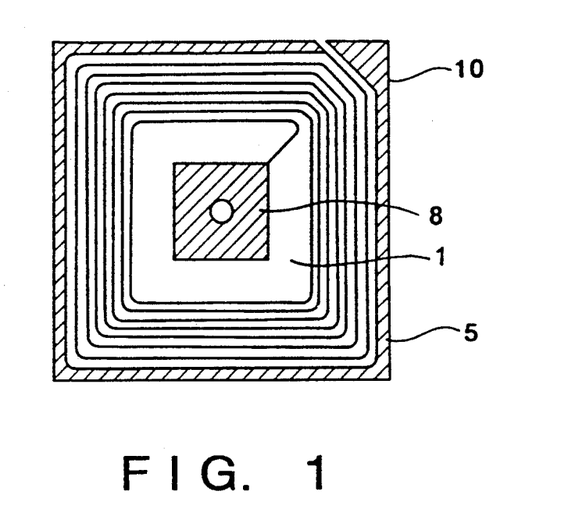
FIG. 1 shows a RL circuit pattern of a resonant tag according to the present invention.
Figure 2:
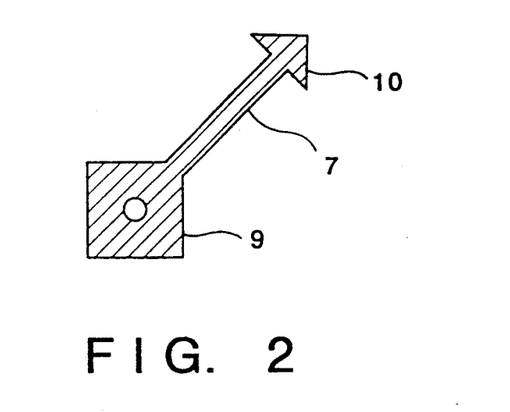
FIG. 2 shows a capacitor circuit pattern of the resonant tag of FIG. 1.

FIG. 1 shows an example of a conductive metal foil pattern formed on the RL circuit and capacitor circuit forming surface, and FIG. 2 shows an example of a conductive metal foil pattern formed on the capacitor circuit forming surface.

In FIGS. 1 and 2, a reference numeral 1 denotes a insulating synthetic resin film which constitutes a dielectric, 5; an inductor circuit of the resonant circuit which is formed on the insulating synthetic resin film 1, 8 and 9; electrode plates which constitute capacitor circuits of the resonant circuit which are formed on the insulating synthetic resin film 1, and 10; terminal portions for electrically connecting the two circuits. The inductor circuit 5, the capacitor circuits 8 and 9 and the terminal portions 10 are formed of a conductive metal foil.

Figure 3:
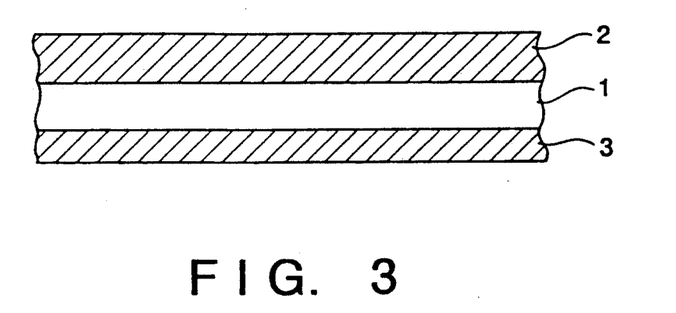
FIG. 3 shows a flexible sheet to which conductive metal foils are fixed.

As shown in FIG. 3, a printed circuit board material on which a resonant circuit is formed is a composite material composed of an insulating synthetic resin film 1 and conductive metal foils 2 and 3, having different thicknesses, formed on the two surfaces of the synthetic resin film 1 by, for example, extrusion or heat lamination.

The inductor circuit pattern (the RL circuit pattern) 5 and the capacitor circuit pattern (the electrode plate) 8, shown in FIG. 1, are formed on one surface of the insulating synthetic resin film 1, and the capacitor circuit pattern (the electrode plate) 9, shown in FIG. 2, is formed on the other surface of the insulating synthetic resin film 1. The patterns 5, 8 and 9 in combination form a resonant circuit. The terminal portion 10 of the capacitor circuit pattern 9 is formed on one surface of the insulating synthetic resin film 1 at a position where it faces the terminal portion 10 of the RL circuit pattern 5 formed on the other surface of the insulating synthetic resin film 1, so that the terminal portions 10 of the two patterns 5 and 9 can be electrically connected to form a resonant circuit.

The circuit element patterns may be printed by various printing methods, including silk screen printing, flexographic printing, letterpress printing and gravure printing.

The insulating synthetic resin film 1 may be formed of a synthetic resin which has a relatively low dielectric dissipation factor, which corresponds to a frequency of designed circuit and which permits accurate tolerance in thickness, such as polyethylene, polypropylene, polystyrene or polyester.

The metal foil may be formed of various metals having a good conductivity, such as gold, silver, copper or aluminum, or various alloys of such metals.

From the viewpoint of production cost, a combination of polyethylene and aluminum foil is preferable because of its inexpensiveness. It is preferable in terms of adhesion also because aluminum foil can be adhered to the polyethylene resin easily. Also, aluminum foil ensures excellent flexibility.

Thus, the present embodiment employs a polyethylene film as the insulating synthetic resin film 1 and an aluminum foil as the conductive metal foil.

Polyethylene employed in this embodiment to form the insulating synthetic resin film may have any density. However, polyethylene having an intermediate density is desired from the viewpoints of the performance of the tag and the mechanical strength thereof.

Figure 4:
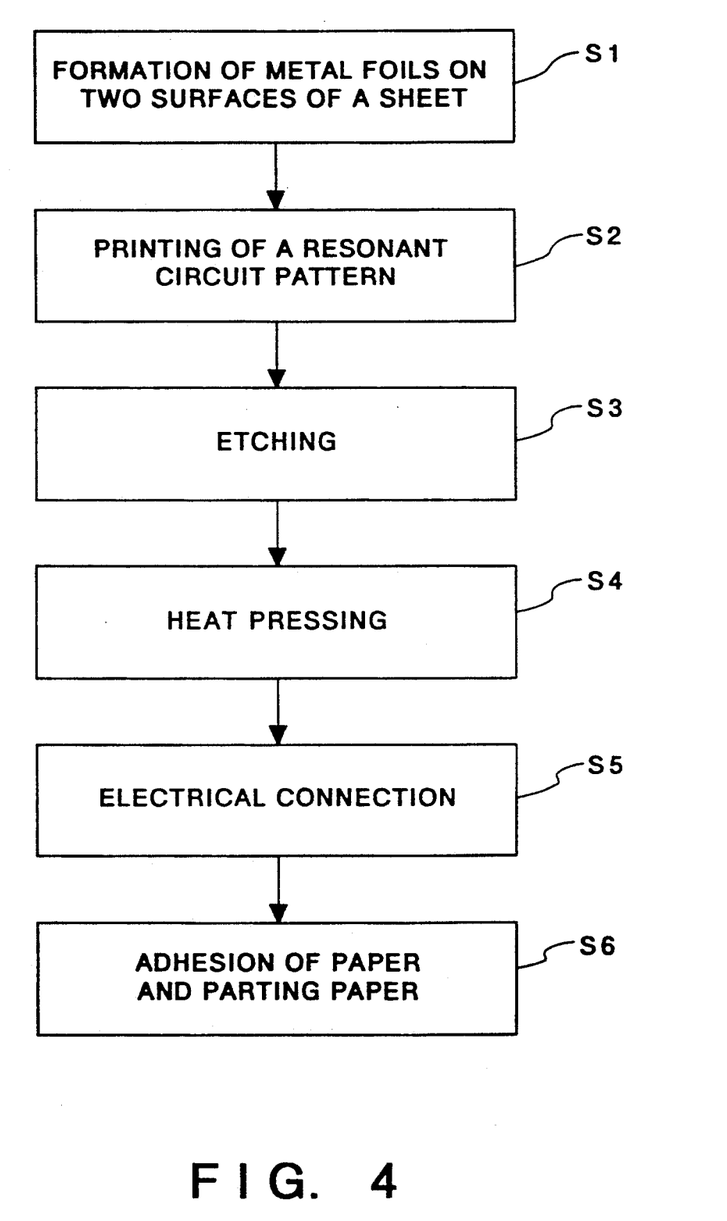
FIG. 4 is a flowchart of the manufacturing process of the resonant tag according to the present invention.

Manufacture process of the thus-arranged resonant tag will be described below with reference to FIG. 4.

When a resonant tag is manufactured, a flexible sheet shown in FIG. 3, composed of the insulating synthetic resin film 1 and the conductive metal foils 2 and 3 formed on the two surfaces of the film 1, is prepared first in step S1.

Various types of aluminum foils, such as those conforming to AA standard (standard enacted by the American Aluminum Association) 1050, 1100 and 1235, can be employed as the conductive metal foils.

The thickness of the metal foils such as aluminum foils is determined by the designed electric resistance, inductance, the etching accuracy and the production cost. However, in this embodiment, to achieve reduction in the electric resistance, a thick foil 2 is used to form the RL circuit pattern and so on. A thin foil 3 is used to form the capacitor circuit pattern because only the electrode plate and the terminal portion are formed thereon and because a thin film reduces the etching cost.

In this embodiment, an aluminum foil having a thickness of 50 microns ($\mu$) is used to form the RL circuit pattern and the capacitor circuit pattern, and an aluminum foil having a thickness of 12 microns ($\mu$) is used to form the capacitor circuit pattern. Both aluminum foils conform to AA standard 1235. However, the thickness and the size are not limited to these values.

The thickness of the insulating synthetic resin film 1, such as polyethylene film, is determined by the design of the resonant tag (the size, frequency, performance and so on), the thickness control accuracy of a machine used to form the film, and the mechanical strength with which the film resists etching and subsequent machinings. To raise the factor Q of the resonance circuit, a thin insulating synthetic resin film is desired as the film on which the capacitor circuit patterns are formed and a small electrode plate of the capacitor circuit pattern is desired.

To set the capacitance of the capacitor circuits of the resonant circuit within a predetermined range, variations in the thickness of the insulating synthetic resin film 1 must be within a predetermined range. Allowable variations in the thickness of the film differ depending on the designed thickness. For example, ±3 microns is allowed for in the case of the film whose designed thickness is 25 microns. In the case of 13 microns, an allowance is 0.5 microns.

Thickness control of ±3 microns is possible. However, it deteriorates yield. Thickness control of 0.5 microns is impossible. Thickness control of ±0.5 microns may be partially possible. However, when productivity and production cost are taken into consideration, it is not practical in terms of mass productivity.

However, the resonant frequency is affected only by the thickness of the portion of the insulating synthetic resin film on which the capacitor circuits are formed, and variations in the thickness of the other portion do not have a great effect on the resonant frequency. Hence, in this embodiment, a synthetic resin film having a thickness of 26 microns with an allowance of ±5 microns is employed, and the portion thereof corresponding to the capacitor circuits is heat pressed to a desired and highly accurate thickness in the manner described below after the circuit patterns are formed on the film. The thickness of the synthetic resin film is not limited to 26 microns. Conventional strict control on the variations in the thickness is not required, either. The subsequent heat pressing process allows the use of a synthetic resin film having a given thickness suited to the existing manufacturing facility.

The insulating synthetic resin film 1 is covered by the conductive metal foils 2 and 3 by either of the following two manners:

(1) The conductive metal foils 2 and 3 are directly adhered to the film 1 extruded from a T die of an extruder.

(2) The insulating synthetic resin film 1 with the conductive metal foils 2 and 3 on the two surfaces are passed between rolls which are heated to a predetermined temperature so as to adhere the film 1 to the metal foils 2 and 3 by means of the heat and the pressure applied by the rolls.

With the machinings conducted subsequent to the adhesion taken into consideration, the insulating synthetic resin film 1 should be adhered to the conductive metal foils at an adhesive strength of 300 g/cm or above.

The adhesive strength may be increased by activating the surface of both types of material or of either material. Corona discharge process may be employed for surface activation.

Furthermore, an adhesive layer may be provided between the two types of material. In that case, an adhesive formed of the same resin as the insulating synthetic resin 1 may be used.

Figure 5:
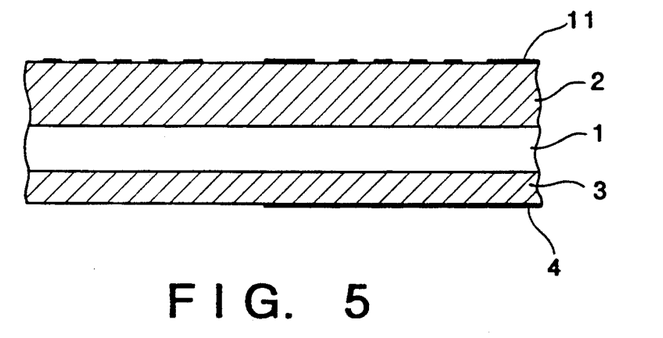
FIG. 5 is a cross-sectional view of a flexible sheet on which patterns are printed.

Next, in step S2, a resonant circuit pattern, consisting of the RL circuit pattern 5, 8 and 10 shown in FIG. 1 and the capacitor circuit pattern 9 and 10 shown in FIG. 2, is printed by the gravure printing method on the surfaces of the conductive metal foils 2 and 3 using an acid-proof or alkali-proof printing ink which resists etching (a polyester type ink which resists etching is employed in this embodiment). FIG. 5 shows the cross-section of a composite material on which this etching-resistant ink is printed. In FIG. 5, a reference numeral 4 denotes an etching resistant printing ink attached to the surfaces of the conductive metal foils.

Next, in step S3, etching process is conducted, and the portion of the metal foils 2 and 3 which does not form the printing patterns is thereby removed using a known etchant, composed of a basic chemical such as an acid (ferric chloride or the like) or alkaline (caustic soda or the like) solution and various admixtures added to the basic chemical, to form an electric circuit.

Although the type of chemical liquid used in this etching process depends on the type of conductive metal foil to be removed, in the case of the aluminum foil employed in this embodiment, an aqueous solution of ferric chloride is used. During the etching, the temperature and the concentration of this etchant are controlled in accordance with the amount of metal foil to be dissolved, the designed circuit patterns, etching rate and so on.

In the case of the spraying method, the liquid pressure at the distal end of the nozzle is also adequately controlled.

Figure 6:
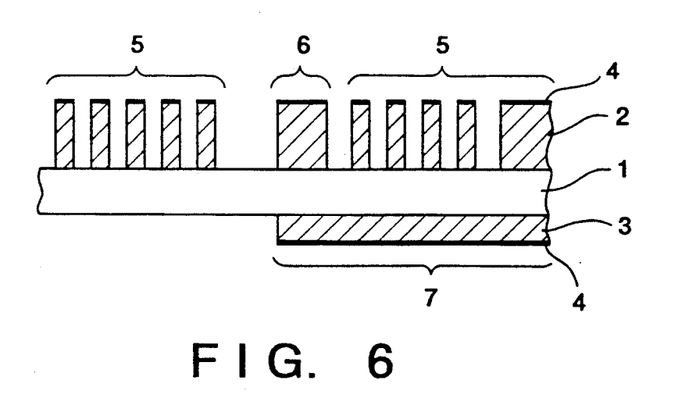
FIG. 6 is a cross-sectional view of a flexible sheet which is subjected to etching.

FIG. 6 shows the cross-section of a composite material which is subjected to the etching process. In FIG. 6, a reference numeral 5 denotes the RL circuit pattern shown in FIG. 1, 6; the capacitor circuit pattern shown in FIG. 1, and 7; the capacitor circuit pattern shown in FIG. 2.

Subsequently, heat pressing is conducted in step S4.

Figure 7:
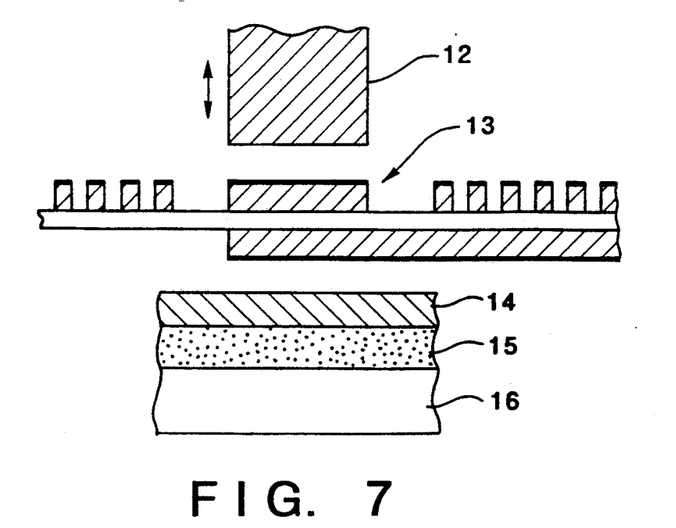
FIG. 7 shows a heat pressing jig employed in the present invention.

FIG. 7 shows the pressing jig used in this heat pressing process.

In FIG. 7, a reference numeral 12 denotes a heating plate which is made of a metal such as stainless steel and in which a heating member (not shown) is disposed. The heating plate can be heated to a desired temperature, and be pressed under a desired pressure against a stainless steel plate 14 by an elevator (not shown). 13 denotes an electrode plate pattern of the resonant tag which has been subjected to the etching process, 14; a stainless steel plate, 15; a heat-resistant rubber such as silicone rubber or Teflon, and 16; a receptor.

The heat pressing process is conducted in the manner described below.

The heating plate 12 heated to a predetermined temperature is pressed under a predetermined pressure against the electrode plate 8 of the capacitor circuit pattern placed on the stainless steel plate 14 in position for a predetermined period of time to heat the electrode plate 8, whereby the polyethylene film, i.e., the dielectric, between the electrode plates is heated through the electrode plate 8, and thereby melted and thinned. The thickness of the dielectric between the electrode plates can be adjusted with a high degree of accuracy by adjusting the pressure under which the plate is pressed and the pressing time.

The temperature to which the heating plate 12 is heated, the pressure under which the heating plate 12 is pressed against the electrode plate of the capacitor circuit pattern 8, and the pressing time can be set to adequate values with the area of the electrode plate and the thickness of the dielectric between the electrode plates taken into consideration.

At that time, a capacitance of the capacitor circuit which ensures a desired resonant frequency is determined by the thickness of the dielectric and the area of the capacitor circuit pattern. For example, assuming that the dimension of the single resonant tag is 40 mm×40 mm and that a desired resonant frequency is 8.2 MHz, the thickness of the dielectric and the dimension of the capacitor circuit pattern must be set to values listed in Table 1.

TABLE 1

| Area of the capacitor electrode plate (mm × mm) | Thickness of the dielectric (micron) |
| --- | --- |
| 13 × 14 | 26 |
| 10 × 10 | 16 |
| 7.5 × 7.5 | 8 |

In the heat pressing jig shown in FIG. 7, in the case where the area of the electrode plate of the capacitor circuit pattern is set to any value indicated on the left column of Table 1, a resonant frequency of 8.2 MHz is achieved when the thickness of the dielectric is set to the corresponding value listed on the right column.

In that case, the pressure and the pressing time may be controlled while the temperature of the heating member 12 is maintained constant. Alternatively, the heating temperature and the pressing time may be controlled while the pressure is maintained constant.

In the heat pressing process, the jig is controlled in the manner described below.

Tables 2 and 3 list the conditions under which the jig is controlled when the dimension of the electrode plate is 10×10 mm while the thickness of the dielectric is reduced from 26 microns to 16 microns and when the dimension of the electrode plate is 7.5 mm×7.5 mm and the thickness of the dielectric is reduced to 8 microns. The above-described thicknesses of the dielectric could be obtained under the same conditions in either case.

Table 2 shows combinations of the pressure under which the heating body 12 is pressed against the electrode plate 8 and the pressing time when the heating temperature is maintained to 250° C.

TABLE 2

| Pressure (kg) | Time (second) |
| --- | --- |
| 3 | 4.5 |
| 4 | 3 |
| 5 | 2 |

Table 3 shows combinations of the heating temperatures of the heating body 12 and the pressing time when the pressure is maintained to 4 kg.

TABLE 3

| Temperature (°C.) | Time (second) |
| --- | --- |
| 200 | 3.5 |
| 250 | 3 |
| 300 | 1.5 |

When the electrode plate of the capacitor circuit pattern is heated and pressed during the heat pressing process, the thickness of the dielectric between the electrode plates can be thinned uniformly to a desired value over the entire surface thereof.

Figure 8:
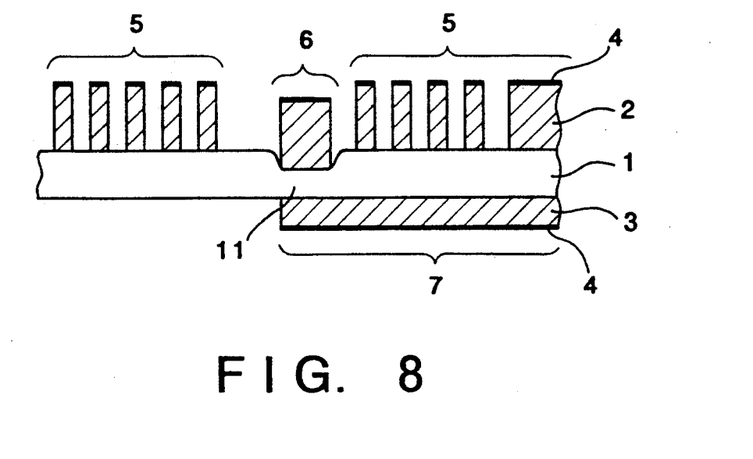
FIG. 8 is a cross-sectional view of a flexible sheet which is subjected to heat pressing.

FIG. 8 shows a state in which the dielectric between the electrode plates of the capacitor circuit patterns is thinned. In this embodiment, the portion of the dielectric which is thinned is substantially only the portion of the dielectric on which the capacitor circuit pattern 8 shown in FIG. 1 is formed. Hence, a sufficient strength of the entire resonant tag can be maintained throughout subsequent machinings and against the stress applied to the tag during the use by a user.

Thus, even when there are variations in the thickness of the insulating synthetic resin film 1 extruded from the extruder in step S1, the dielectric between the electrode plates of the capacitor circuit pattern can be thinned with a high degree of accuracy substantially regardless of the variations.

Furthermore, control of the thickness of the dielectric is easy. For example, a dielectric film having a thickness of 26 microns can be readily thinned to 0.2 microns to below.

Furthermore, with a thickness restricting jig mounted on the end of the heat pressing jig, it is possible to control the thickness of the dielectric reliably and accurately regardless of the pressure and the pressing time.

Controlling the thickness of the dielectric is further described. The average thickness of the dielectric film produced by the protrusion method is 26 microns. The breakdown voltage of the capacitor using the film is over 200 volts. This voltage is much too high to allow for deactivization of the tag by placing it in a magnetic field. However, by reducing the thickness of the tag to a desirable value. it is possible to deactivate tags with a significantly lower voltage such as 2 or 3 volts. That is, such a lower voltage can cause an arch discharge, which produces a conductive path between both electrodes of the circuit pattern.

A discussion on the thickness of the dielectric film in view of the deactivation of the resonant tag follows. In order to provide tags with deactivation characteristics which can be used as commercial products, the thickness of the dielectric film should be 15 microns. If the thickness is reduced to 8 microns, a perfect deactivation is guaranteed. Thus, by controlling the thickness of the dielectric, the breakdown voltage of the capacitor can be altered. In other words, by suitably changing the thickness of the dielectric, it becomes unnecessary to apply additional provisional treatment to the dielectric (as is required in the conventional product) to induce breakdown.

Sandwiched between electrode plates, a synthetic resin film with a low melting point and low dielectric loss, such as a polyethylene film, has heat and pressure applied to it by a heating press on one or both sides of the electrode, as to reduce the thickness of the film to 8 microns. During this process, virtually all heat is applied directly to the polyethylene film because the film is covered with a very thin highly conductive aluminum foil. The applied heat causes a change in the molecular structure of the polyethylene film, particularly in the direction of thickness, in which carbon molecules condense. This reduces the dielectric property of the material, thus lowering the voltage necessary for breakdown. Accordingly, this film is able to respond to a very low electromagnetic field.

The above observation may document one reason why the resonant tag can be deactivated at a substantially lower voltage.

In the case of the resonant tag in which the electrode plate of the capacitor circuit pattern is located at the center of the RC circuit pattern (the coil), passage of the magnetic flux is interferred by the magnetic field. Therefore, an electrode plate having a small area is desired to improve the performance of the resonant tag. The area of the electrode plate is not a factor which determines the general performance of the resonant tag but a factor which, together with the thickness of the dielectric, affects the performance by changing the frequency.

In the heat pressing process, the thickness of the dielectric can be controlled to a given value which cannot be obtained by the extruder with a high degree of accuracy. Reduction in the thickness of the insulating synthetic resin film 1 reduces the area of the electrode plate of the capacitor circuit pattern accordingly. This raises the factor Q of the resonant tag. Thus, the heat pressing process is effective also in raising the factor Q of the resonant circuit.

Figure 9:
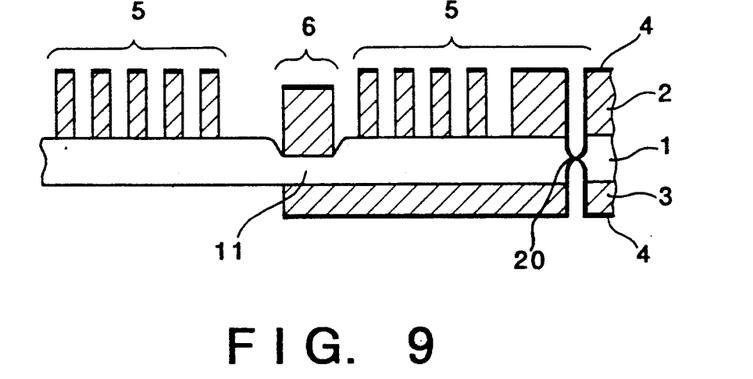
FIG. 9 is a cross-sectional view of a flexible sheet in whose connecting portions are electrically connected.

Subsequently, in step S5, the terminal portions 10 are electrically connected, by means of which the resonant frequency circuit is formed. In this way, the size of the resonant tag can be reduced. FIG. 9 shows this state. In FIG. 9, a reference numeral 20 denotes a connected portion between the terminal portions 10.

Thereafter, in step S6, a sheet of good quality paper having, for example, a weight of 55 g/m² is adhered on the surface of the flexible sheet on which the RL circuit pattern is formed using an acrylic resin adhesive, and a sheet of parting paper having, for example, a weight of 60 g/m² is adhered on the other surface of the flexible sheet using a rubber type adhesive.

Figure 10:
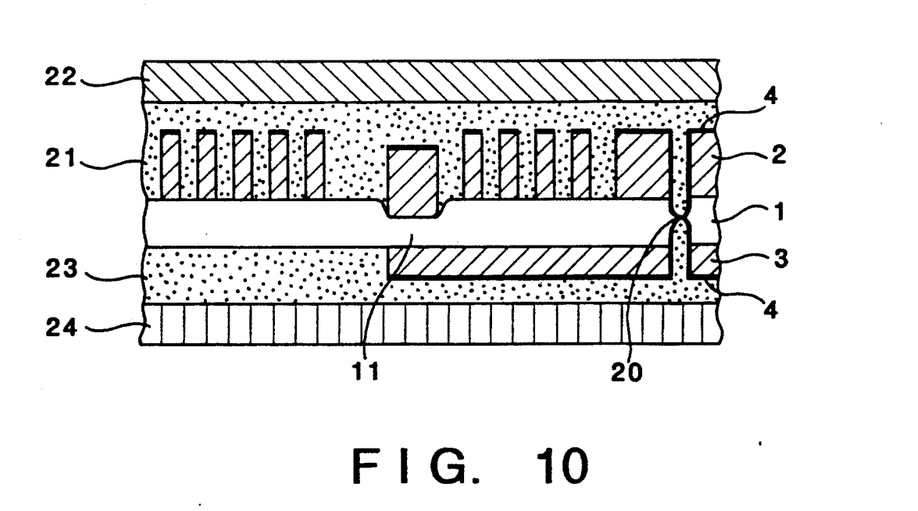
FIG. 10 shows a flexible sheet with a sheet of paper and a sheet of parting paper adhered thereto.

FIG. 10 shows the cross-section of a multi-layer flexible sheet on which the paper and the parting paper are adhered.

In FIG. 10, a reference numeral 21 denotes an adhesive on the RL circuit pattern forming surface, 22; a sheet of good quality paper, 23; an adhesive on the capacitor circuit pattern forming surface, and 24; a sheet of parting paper.

Thus, a final product that can be readily adhered to a desired commodity is obtained.

For the simplification of explanation, the above description centered on the single resonant tag. However, in a practical operation, the metal foil formation, the pattern printing, etching, the heat pressing and paper and parting paper adhesion are conducted using a roll of material having dimensions of 850 mm × 1000 m. Hence, an unnecessary portion of the multi-layer sheet with the paper and the parting paper adhered thereto obtained in step S6 is removed except for the parting paper by a platen type die cutter. At that time, each product has dimensions of 40 mm × 40 mm. Thereafter, sheet-like tags alined in a row are rolled with the parting paper facing outward. The length of the roll is generally 100 m.

In this embodiment, the multi-layer sheet has the paper and the parting paper adhered thereto. However, any material can be used so long as it can retain the resonant circuit and can be peeled off when the resonant tag is used. Examples of the materials include a plastic sheet.

In this embodiment, it is possible to readily manufacture a resonant tag having a desired resonant frequency at a low cost regardless of variations in the thickness of the dielectric obtained in step S1. Such a resonant tag allows the frequency range of the resonant tag detector to be narrowed. As a result, a resonant tag system which is highly sensitive and which malfunctions less can be obtained.

In this embodiment, only the portion of the dielectric corresponding to the electrode plate of the capacitor circuit pattern is thinned. However, thinning may also be conducted over the portion of the dielectric corresponding to the entire resonant circuit to make the thickness thereof uniform. At that time, a thickness restricting jig may be used to limit the thickness to a desired one.

As will be understood from the foregoing description, it is possible according to the present invention to form a resonant circuit having a desired resonant frequency on a tag with a high degree of accuracy. Reliable detection of a tag is enabled by the detection of the resonant frequency of the resonant tag.

The present invention is not limited to the above embodiments and various changes and modifications can be made within the spirit and scope of the present invention. Therefore, to apprise the public of the scope of the present invention the following claims are made.

What is claimed is:

1. A resonant tag comprising:
  a single insulating thin film;
  a conductive capacitor element pattern and a conductive inductor element pattern formed on one surface of said insulating thin film, said conductive capacitor element pattern corresponding to a resonant frequency and said conductive inductor element pattern being located circumferentially around the conductive capacitor element pattern; and
  a conductive capacitor element pattern formed on the other surface of said insulating thin film at a position which faces said conductive capacitor element pattern formed on said one surface, said conductive capacitor element pattern corresponding to said resonant frequency,
  wherein at least a portion of said insulating thin film on which said two conductive capacitor element patterns are formed is reduced in thickness to space said capacitor elements to enable deactivation of the tag by placement in an electromagnetic field and also to space said capacitor elements to produce said resonant frequency, and wherein said conductive capacitor and inducator patterns form LC resonant circuit having an inherent resonant frequency.

2. A resonant tag according to claim 1, wherein said resonant circuit is formed by electrically connecting, via a throughole in said film, said conductive patterns formed on the two surfaces of said insulating thin film.

3. A method of manufacturing a resonant tag comprising the steps of:
  forming a conductive thin film on two surfaces of an insulating thin film;

printing, on a surface of one of said conductive thin films, a first conductive pattern composed of an inductor element and a capacitor element corresponding to a resonant frequency of a resonant circuit using an ink which resists etching, as well as a second conductive pattern composed of a capacitor element corresponding to said resonant frequency of said resonant circuit on a surface of the other insulating thin film at a position which faces said capacitor element formed on said one conductive thin film using said ink which resists etching;

removing non-printed portion of said conductive thin films by etching;

thinning at least a portion of said insulating thin film corresponding to said capacitor element pattern in a resonant circuit pattern formed by said etching process to a desired thickness; and forming a LC resonant circuit in said desired resonant circuit pattern by electrically connecting, via a throughole, in said film said first conductive and second conductive patterns.

4. A method of manufacturing a resonant tag according to claim 3, further comprising a step of detachably adhering the insulating thin film on which said conductive patterns subjected to the etching process or the circuit formation process are formed to a flexible thin film.

5. A method of manufacturing a resonant tag according to either of claims 3 and 4, wherein said thinning step is conducted by pressing a heat-pressing member heated to a temperature against said portion to be thinned under pressure for a period of time.

6. A resonant tag according to claim 1, wherein the portion on which said two conductive capacitor element patterns are formed is reduced in thickness to less than 15 microns.

* * * * *